(12) United States Patent
Apro

(10) Patent No.: US 9,727,127 B2
(45) Date of Patent: Aug. 8, 2017

(54) NETWORK DEVICE

(71) Applicants: SIEMENS CANADA LIMITED, Oakville, Ontario (CA); Attila Apro, Barrie, Ontario (CA)

(72) Inventor: Attila Apro, Barrie (CA)

(73) Assignee: SIEMENS CANADA LIMITED, Oakville, Ontario (CA)

( * ) Notice: Subject to any disclaimer, the term of this patent is extended or adjusted under 35 U.S.C. 154(b) by 0 days.

(21) Appl. No.: 14/760,028

(22) PCT Filed: Dec. 4, 2013

(86) PCT No.: PCT/IB2013/060648
§ 371 (c)(1),
(2) Date: Jul. 9, 2015

(87) PCT Pub. No.: WO2014/087356
PCT Pub. Date: Jun. 12, 2014

(65) Prior Publication Data
US 2016/0041609 A1    Feb. 11, 2016

Related U.S. Application Data

(60) Provisional application No. 61/733,565, filed on Dec. 5, 2012.

(51) Int. Cl.
*H05K 7/00*    (2006.01)
*G06F 3/00*    (2006.01)
(Continued)

(52) U.S. Cl.
CPC ......... *G06F 3/002* (2013.01); *H01R 12/7005* (2013.01); *H01R 13/5219* (2013.01);
(Continued)

(58) Field of Classification Search
None
See application file for complete search history.

(56) References Cited

U.S. PATENT DOCUMENTS

| | | | | |
|---|---|---|---|---|
| 4,152,750 A | * | 5/1979 | Bremenour | ......... H05K 7/1477 361/679.4 |
| 4,313,150 A | * | 1/1982 | Chu | ..................... H05K 7/1409 361/755 |

(Continued)

OTHER PUBLICATIONS

PCT International Search Report dated Apr. 9, 2014 corresponding to PCT International Application No. PCT/IB2013/060648 filed Dec. 4, 2013 (4 pages).

(Continued)

*Primary Examiner* — Courtney Smith
*Assistant Examiner* — Rashen E Morrison

(57) ABSTRACT

A network device including a mounting rail having at least one mounting location. The mounting location defined by one or more device reference locators that define a mounting direction relative to that mounting location. A device connector attached to a device printed circuit board (PCB) is positioned to have a connecting direction parallel to the mounting direction.

At least one module is provided for mounting to one of the mounting locations. The module including one or more module reference locators each adapted to engage one of the device reference locators when the module is positioned to be mounted to the mounting location. A module connector attached to a module PCB is positioned to have a connecting direction parallel to the mounting direction;

The module connector and the device connector are positioned such that when the one or more module reference locators are each engaged with the one of the one or more device reference locators, and the module is advanced in the mounting direction towards the mounting location, the mod- (Continued)

ule connector and the device connector connect as the module mounts the mounting location to connect the module to the network device.

15 Claims, 9 Drawing Sheets

(51) Int. Cl.
  *H04Q 1/02* (2006.01)
  *H01R 12/70* (2011.01)
  *H01R 13/52* (2006.01)
  *H05K 7/14* (2006.01)
(52) U.S. Cl.
  CPC ............... *H04Q 1/09* (2013.01); *H04Q 1/13* (2013.01); *H05K 7/14* (2013.01)

(56) References Cited

U.S. PATENT DOCUMENTS

| | | | | |
|---|---|---|---|---|
| 4,558,914 A * | 12/1985 | Prager | ............. | H05K 7/1441 361/679.4 |
| 5,816,831 A * | 10/1998 | Clark | ............. | H01R 12/725 439/541.5 |
| 6,008,985 A * | 12/1999 | Lake | ............. | G05B 19/0423 361/679.32 |
| 6,038,130 A * | 3/2000 | Boeck | ............. | H01R 9/2675 361/729 |
| 6,047,172 A * | 4/2000 | Babineau | ............. | H05K 9/0058 361/800 |
| 6,272,019 B1 * | 8/2001 | Edwards | ............. | G02B 6/4201 361/730 |
| 6,296,518 B1 * | 10/2001 | Avery | ............. | H01R 9/2408 439/541.5 |
| 6,511,345 B1 * | 1/2003 | Hwang | ............. | H01R 12/707 439/541.5 |
| 6,532,155 B2 * | 3/2003 | Green | ............. | G02B 6/4277 361/730 |
| 6,592,388 B1 * | 7/2003 | Meiners | ............. | G06F 1/183 439/310 |
| 6,692,159 B2 * | 2/2004 | Chiu | ............. | G02B 6/3825 385/53 |
| 6,778,387 B2 * | 8/2004 | Fairchild | ............. | G11B 33/1426 165/80.3 |
| 6,802,737 B2 | 10/2004 | Bergner et al. | | |
| 6,840,680 B1 * | 1/2005 | Chiu | ............. | G02B 6/3825 385/53 |
| 6,916,196 B2 * | 7/2005 | Long | ............. | H05K 9/0058 439/352 |
| 7,291,032 B1 * | 11/2007 | Carver | ............. | H01R 43/26 439/310 |
| 7,452,216 B2 * | 11/2008 | Murr | ............. | H01R 13/665 439/74 |
| 7,601,025 B1 * | 10/2009 | Phillips | ............. | H01R 13/6658 439/541.5 |
| 7,866,896 B2 | 1/2011 | Baker et al. | | |
| 2001/0030855 A1 * | 10/2001 | Green | ............. | H01R 12/7005 361/754 |
| 2002/0093796 A1 * | 7/2002 | Medina | ............. | G02B 6/4261 361/728 |
| 2004/0033720 A1 | 2/2004 | Bergner et al. | | |
| 2006/0044674 A1 * | 3/2006 | Martin | ............. | G11B 23/049 360/99.13 |
| 2006/0050429 A1 * | 3/2006 | Gunderson | ............. | G11B 33/122 360/99.21 |
| 2006/0077776 A1 * | 4/2006 | Matsushima | ............. | G11B 33/128 369/30.27 |
| 2007/0173092 A1 * | 7/2007 | Von Arx | ............. | H01R 13/514 439/188 |
| 2007/0293954 A1 * | 12/2007 | Pfingsten | ............. | H01R 13/514 700/22 |
| 2008/0239650 A1 * | 10/2008 | Fujie | ............. | G06F 1/187 361/679.35 |
| 2009/0292852 A1 * | 11/2009 | Justice | ............. | G06F 1/187 710/303 |
| 2011/0051342 A1 * | 3/2011 | Crippen | ............. | G06F 1/185 361/679.4 |
| 2011/0069443 A1 * | 3/2011 | Williams | ............. | G06F 1/187 361/679.33 |
| 2011/0090633 A1 * | 4/2011 | Rabinovitz | ............. | G06F 1/184 361/679.31 |
| 2011/0228473 A1 * | 9/2011 | Anderson | ............. | G02B 6/4452 361/679.58 |
| 2012/0075815 A1 | 3/2012 | Fuke et al. | | |
| 2013/0157478 A1 * | 6/2013 | Naufel | ............. | H01R 12/7082 439/59 |
| 2015/0173249 A1 * | 6/2015 | McGrath | ............. | G11B 33/142 361/679.33 |
| 2015/0334879 A1 * | 11/2015 | Fricker | ............. | H05K 7/20809 361/679.47 |
| 2015/0356051 A1 * | 12/2015 | Benson | ............. | G06F 1/16 710/313 |

OTHER PUBLICATIONS

European Search Report dated Jun. 22, 2016 corresponding to European Application No. 13860318.8 filed Dec. 4, 2013 (7 pages).

* cited by examiner

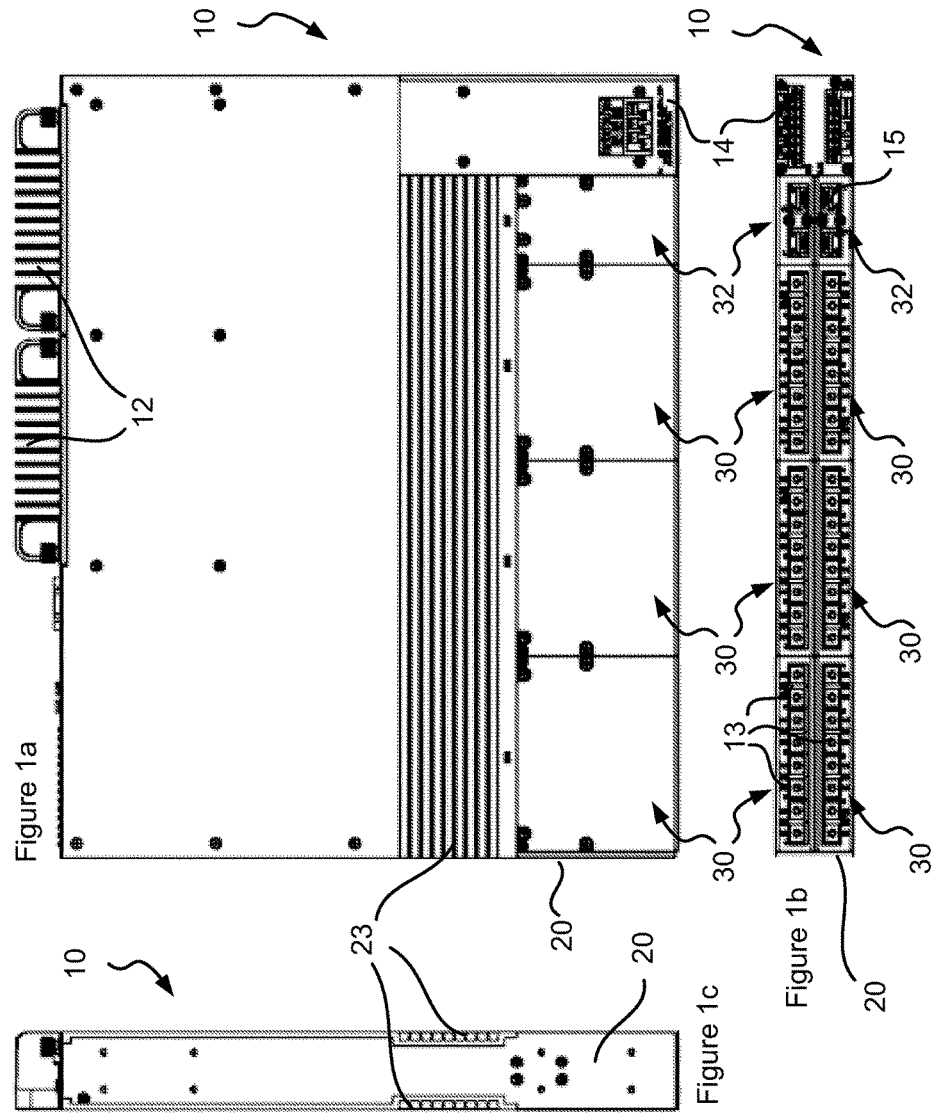

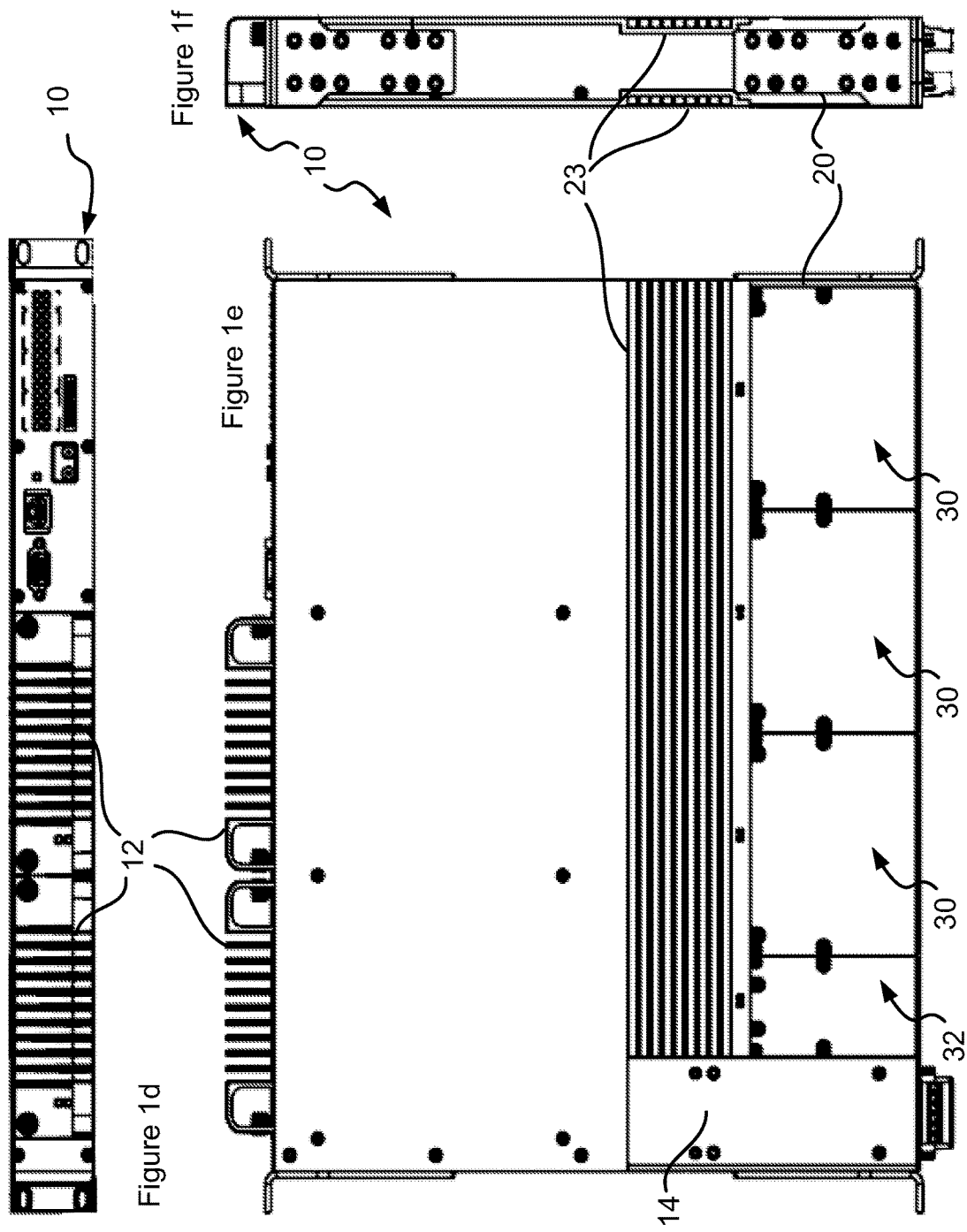

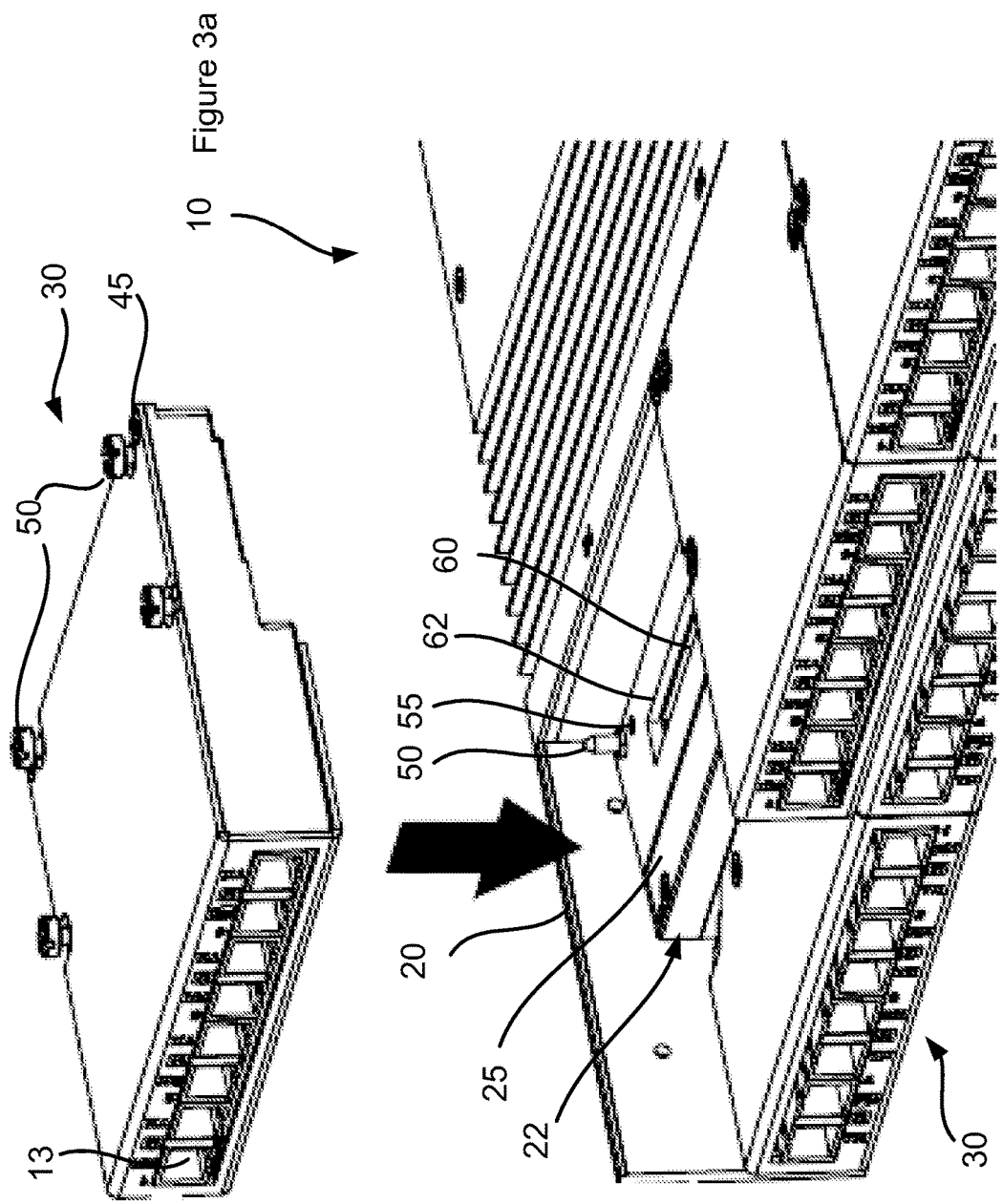

NETWORK DEVICE

CROSS REFERENCE TO RELATED APPLICATION

This application claims priority to and all benefits accruing from U.S. Provisional Patent Application 61/733,565 filed in the United States Patent and Trademark Office on Dec. 5, 2012.

FIELD OF THE INVENTION

This invention relates to network devices for connecting to a network, such as an Ethernet network. In particular, the invention relates to network devices that connect to the network and provide network interconnection.

BACKGROUND

Network devices provide an important role in receiving and forwarding data packets on a network. Depending upon their role in the network, network devices may be operative to provide a network support function by receiving and forwarding data packets intended for other devices on the network.

In order to provide for a network device that can be repaired in the event of a communications failure, network devices may be provided with modular input/output cards that removably engage with a printed circuit board (PCB) of the network device. While the removable engagement provides a convenient means to replace a component of the network device without having to resort to replacement of the entire network device, there is a risk that the engagement functionality provides a potential point of failure.

Conventional means for providing modular input/output cards have relied upon the use of orthogonal interposer cards that extend from the main device PCB to provide a connection plane for the module input/output cards. It has been found that the additional connections provide a potential point of mechanical or electrical failure. Alternative solutions require specialized connectors that allow the input/output module PCB to be inserted into the device connector of the device PCB. These specialized orthogonal connectors have been found to be more expensive, and potentially create another point of mechanical or electrical failure.

There is a need for an improved modular input/output connection to a network device.

SUMMARY

In an embodiment a network device is provided. The network device comprising a mounting rail of the network device having at least one mounting location defined by one or more device reference locators, the one or more device reference locators defining a mounting location and a mounting direction to the mounting location; the mounting location including a device connector attached to a device printed circuit board (PCB) and positioned to have a connecting direction parallel to the mounting direction; a module for mounting to the mounting location, wherein the module includes corresponding one or more module reference locators each adapted to engage a one of the one or more device reference locators when the module is positioned to be mounted to the mounting location, and the module includes a module connector attached to a module PCB and positioned to have a connecting direction parallel to the mounting direction; wherein the module connector and the device connector are positioned such that when the one or more module reference locators are each engaged with the one of the one or more device reference locators, and the module is advanced in the mounting direction towards the mounting location, the module connector and the device connector connect as the module mounts the mounting location to connect the module to the network device.

In an implementation of the network device, the device connector is attached to the device PCB with a device connecting direction approximately orthogonal to the device PCB, wherein the module connector is attached to the module PCB with a module connecting direction approximately orthogonal to the surface of the module PCB, and wherein the mounting direction is approximately orthogonal to the device PCB and the module PCB when the one or more module reference locators are each engaged with the one of the one or more device reference locators.

In an implementation, the mounting location comprises a device mounting surface and wherein the module has a corresponding device mounting surface, and wherein when the module is mounted on the mounting location, the module mounting surface is in contact with the device mounting surface.

In an implementation, a device aperture may be provided through the device mounting surface and a module aperture through the module mounting surface. The device connector can be located to connect to the module connector through the device aperture, and the module connector located to connect to the device connector through the module aperture.

In an implementation, the device connector and the module connector comprise a free height connector pair, the free height connector pair having a spacing to connect the device connector to the module connector when the module mounting surface is in contact with the device mounting surface.

In an implementation, the module mounting surface and the device mounting surface are in sealing engagement when the module is mounted to the mounting location In an implementation, at least one fastener may be provided to secure the module to the mounting location, wherein the one or more device reference locators and the one or more module reference locators cooperate to position each of the at least one fastener relative to a corresponding fastener receiver on the mounting rail.

In an implementation, the mounting rail further comprises a support portion adapted to capture and constrain the device PCB at a location proximate the device connector.

In an implementation, the mounting rail comprises at least a pair of opposed mounting locations on opposite sides of the mounting rail. The mounting direction for each of the pair of opposed mounting locations being towards that side of the mounting rail, in opposite directions from one another. A second module may be provided for mounting with the module as an opposed pair of modules mounted to the opposite mounting locations. In an implementation, the device connectors of the opposed mounting locations are located on opposite sides of the device PCB, such that when the opposed pair of modules are mounted to the opposite mounting locations, and the module connectors of the opposed pair of modules are connected to the device connectors of the opposed mounting locations, the connectors are in opposed alignment.

BRIEF DESCRIPTION OF THE DRAWINGS

FIGS. 1*a*-*f* are elevation views of an implementation of a network device.

FIG. 3a illustrates an implementation of a bypass module of a network device in a connected state.

DETAILED DESCRIPTION

Figure 2:
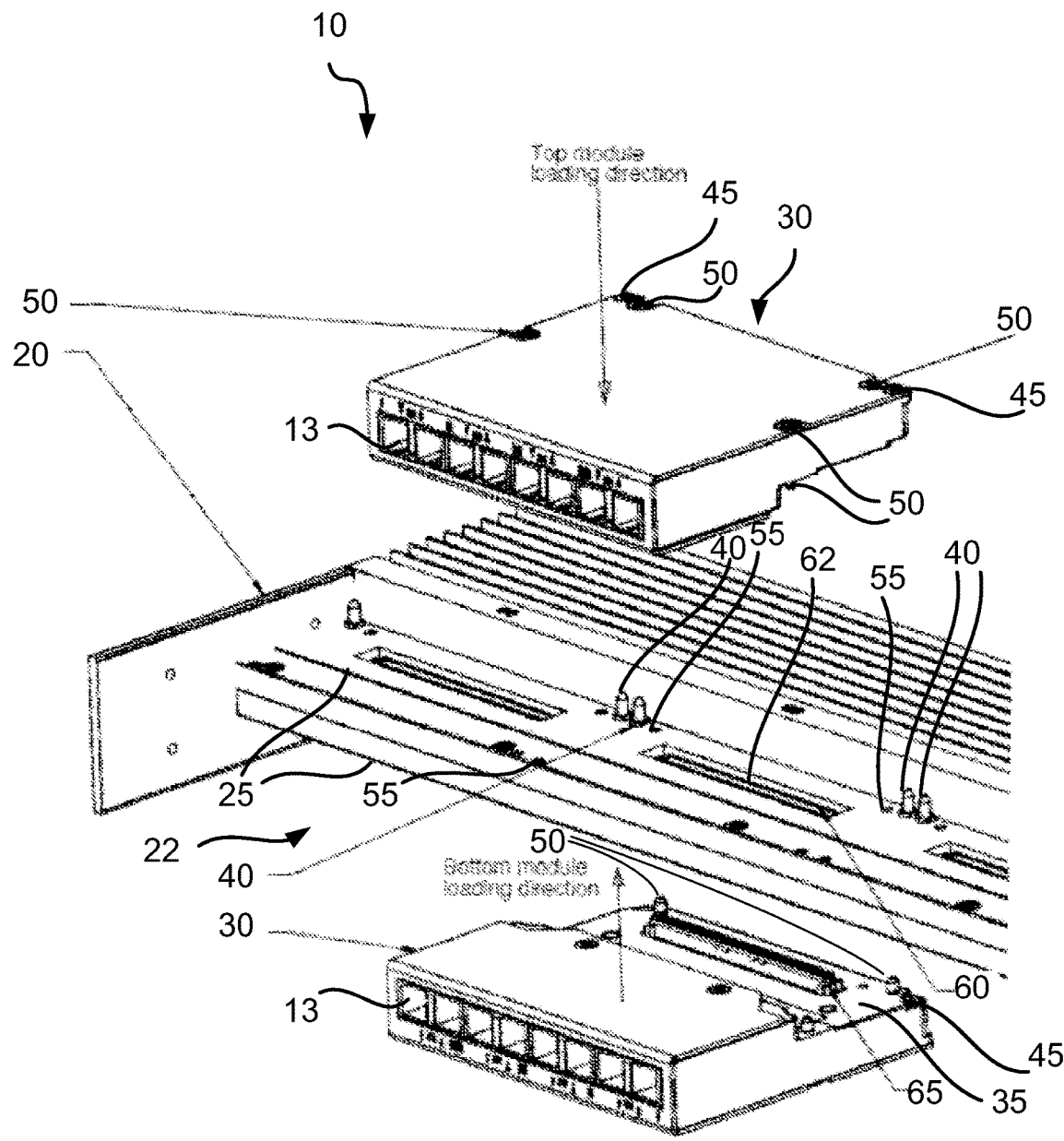
FIG. 2 is a partial rear isometric view of an implementation of a network device.

FIGS. 1a-f, are elevation views of an exemplary implementation of a network device 10. In the implementation of FIGS. 1a-1f, the network device 10 comprises an Ethernet switch that provides a plurality of network connections.

FIG. 1a is a top view of the network device 10, comprised of a chassis 20 that supports and protects a printed circuit board (PCB) and associated circuit elements (not visible in this view). The network device 10 is supplied with power by a pair of power supplies, that include heat sinks 12 projecting outside the chassis 20. A series of cooling fins 23 assist in dissipating heat generated by the network device 10. A terminal block 14 provides connections for receiving power to the network device 10. A plurality of removable communications modules 30, 32 are also visible in the view.

Referring to FIG. 1b, a 'front' view showing a plurality of fiber optic Ethernet ports 13 provided by the plurality of removable communications modules 30. In the implementation, the modules 30 are shown as opposed pairs of a 'top' module 30 and a 'bottom' module 30. As will be appreciated, use of terms such as 'front', 'top', 'bottom', and 'rear' are for description purposes with reference to their presentation in the drawings only, and are not intended to be limiting for a field installation of the network device 10.

The modules 30 may all be of the same size, as illustrated, or may vary in dimensions. The modules 30 may all comprise the same networking format, or may comprise different networking formats. For instance, an additional pair of removable modules 32 providing 4 copper Ethernet ports 15 are shown, each of a smaller size than one of the modules 30. While the description below refers specifically to the communications module 30 for clarity, the additional pair of modules 32 can connect to the network device 10 in the same manner as the modules 30.

FIGS. 1c and 1f are side views of the network device 10. FIG. 1d is a 'back' view of the network device 10 showing the heat sinks 12 and a variety of other input/output connections to the network device 10. FIG. 1e is a bottom view of the network device 10 showing the bottom of the terminal block 14, and communications modules 30, 32. As mentioned above, the modules 30, 32 shown in FIG. 1e are each opposed to a module 30, 32 shown in FIG. 1a.

FIG. 2 is a partial rear isometric view of an exemplary implementation of a network device 10. In FIG. 2 there are no modules 30 mounted on the mounting rail 22, but opposed modules 30 are illustrated in position ready for mounting. In the implementation of FIG. 2, a rear portion of the chassis 20 comprises a mounting rail 22 that provides opposed device mounting surfaces 25 for receiving and supporting the plurality of communication modules 30, 32. In an alternate implementation, not illustrated, the chassis 20 may provide a single device mounting surface 25.

The chassis 20 is adapted to provide one or more specific mounting locations on each of the device mounting surfaces 25 to receive the modules 30. Each of the modules 30 comprise a complementary module mounting surface 35 adapted to interface with a portion of one of the device mounting surfaces 25. Each mounting location being defined by one or more device reference locators 40 which are used to interface with corresponding complementary module reference locators 45 of a module 30 when mounting the module 30 to the chassis 20.

In the implementation of FIG. 2, two device reference locators 40, in the form of guide pins, define a mounting location for each of the modules 30, 32. Each module 30, 32 has corresponding complementary module reference locators 45 in the form of receptacles such as holes or recesses adapted to capture and constrain the guide pins. As will be appreciated, the relative locations of the guide pins and the receptacles may be reversed such that the device 10 includes receptacles and the module 30 includes guide pins.

When the device reference locators 40 are interfaced with the module reference locators 45 of a module 30, 32 being mounted on the mounting rail 22, the mounting module 30, 32 is constrained to move in a direction perpendicular to the mounting surface 25, parallel to a mounting axis of the reference locators 40. The device reference locators act to cooperate with the module reference locators 45 to position the module 30, 32 with reference to the device aperture 62 in the mounting rail 22 that provides access to a device connector 60 such as a free height connector. The positioning ensures alignment between the device connector 60 and a corresponding module connector 65 on the module 30, 32 when mounting the module 30, 32 on the mounting rail 22.

While guide pins are illustrated in FIG. 2, other implementations of device reference locators 40 are contemplated, including features formed into the chassis with complementary features formed into the module 30, 32 such as a dovetail.

In an implementation, the modules 30, 32 are each reversible such that they may be mounted to either side of the mounting rail 22 by flipping the module 30 over to orient the module mounting surface 35 to face one of the device mounting surfaces 25. In FIG. 2, the two modules 30 are each illustrated with an opposite orientation to one another, illustrating the mounting of each module 30 to one of the two opposed device mounting surfaces 25 illustrated in FIG. 2.

Fasteners 50, in the form of captive screws in the implementation of FIG. 2, are provided to secure the module 30, 32 to the mounting rail 22. Corresponding fastener receivers 55, in the form of threaded holes in the implementation of FIG. 2, are located in the mounting rail 22. The device reference locators 40 serve to position the module 30, 32 on the mounting location to connect with the device connector 60 and to position the fasteners 50 in relation to the fastener receivers 55 to provide operative engagement of the fasteners 50 with the fastener receivers 55.

Figure 3B:
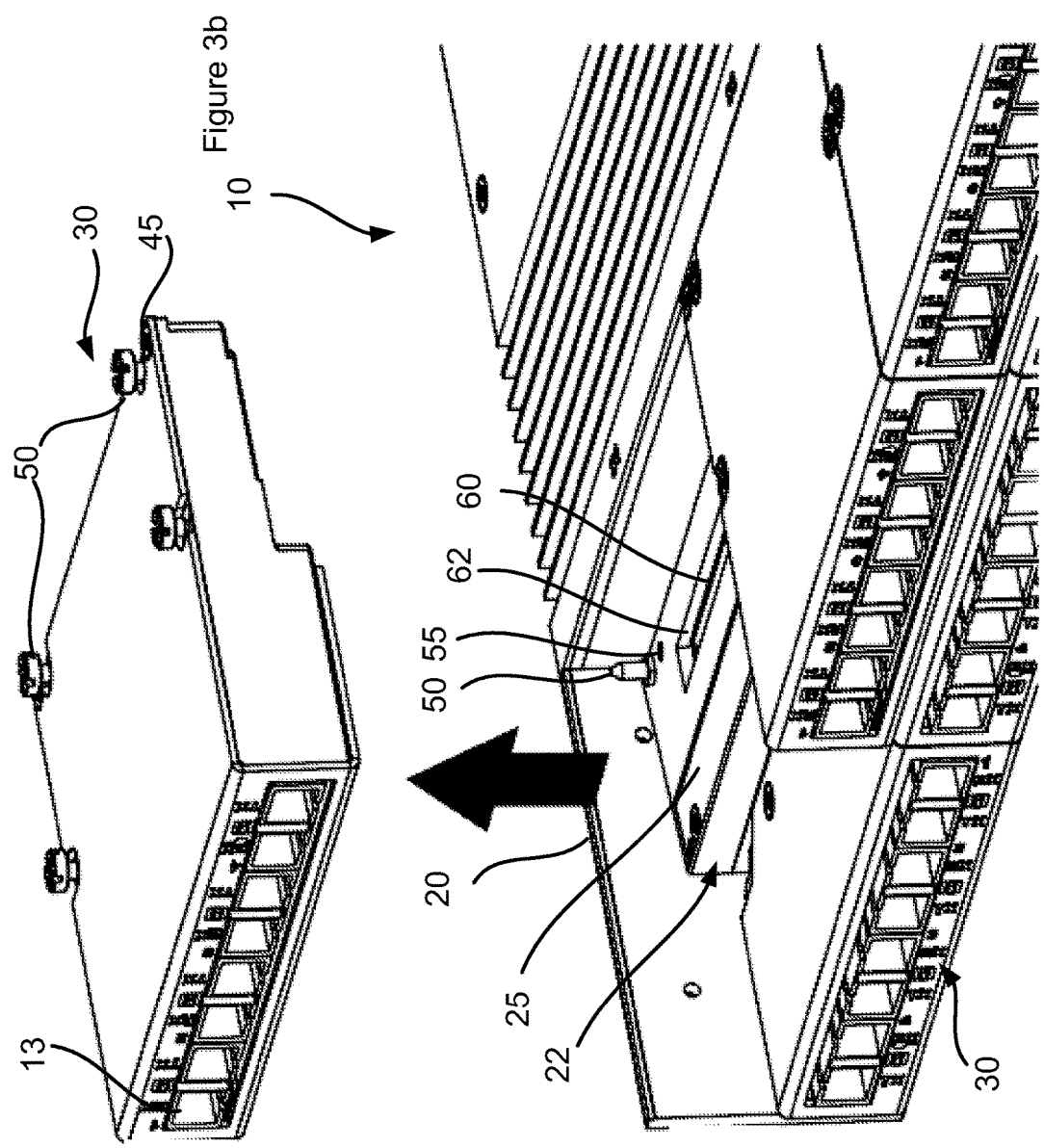
FIG. 3b illustrates an implementation of a bypass module of a network device in a bypass state.

FIGS. 3a and 3b illustrate the mounting and subsequent removal of a module 30 from the mounting rail 22. The module 30 of FIGS. 3a and 3b is at an end position of the mounting rail 22, and is shown in relation to the other modules 30 being mounted to the mounting rail 22. As illustrated, the load or unload direction of the module 30 from the mounting rail 22 is in the same direction as the connection direction of the device connector 60 and the module connector 65, such that mounting the module 30 on the mounting rail 22 connects the device connector 60 to the module connector 65.

Figure 4A:
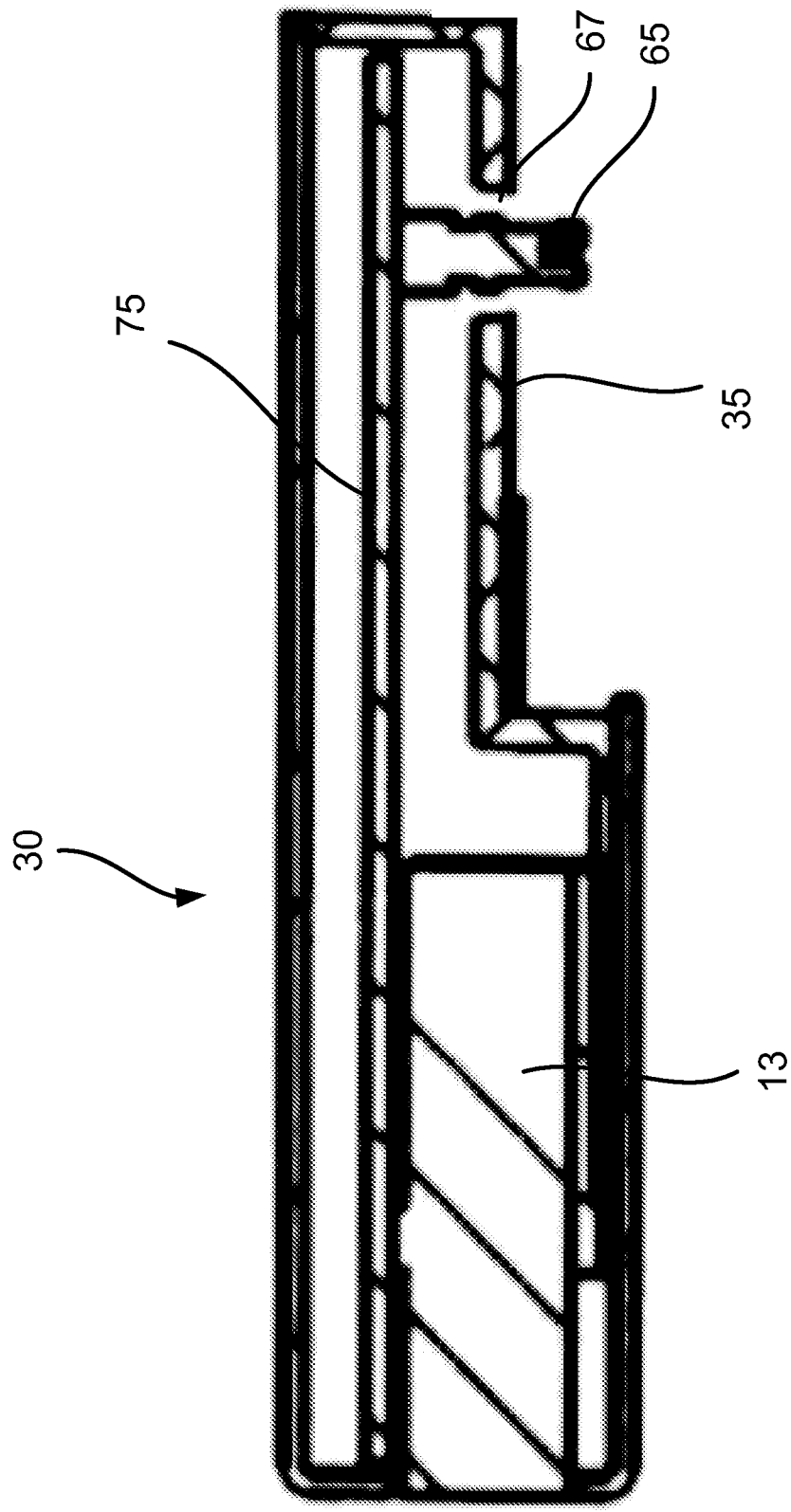
FIG. 4a is a section view of a module of a network device.
Figure 4B:
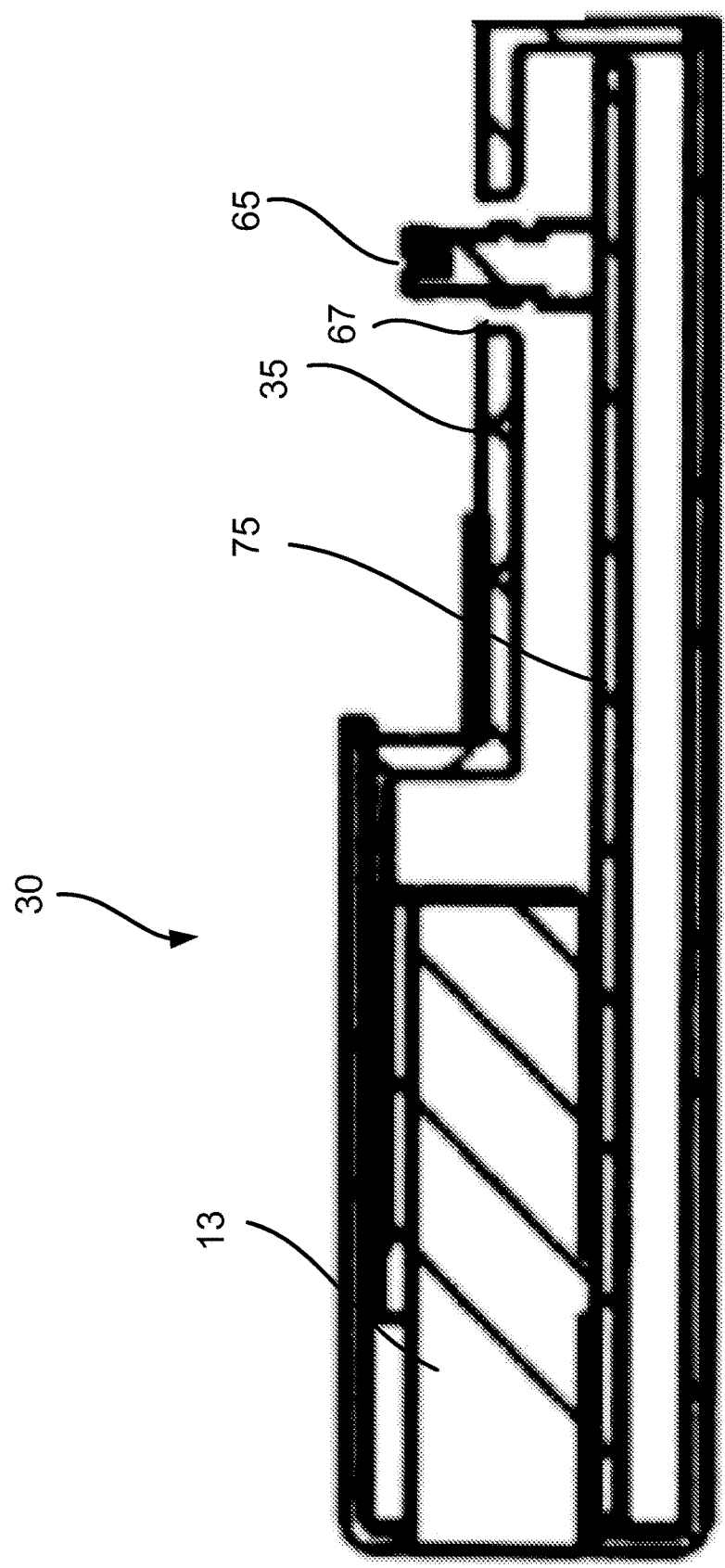
FIG. 4b is a section view of another module of a network device.

FIG. 4a illustrates a cross-section view of a module 30 oriented for mounting in a 'top' position on the mounting rail 22, and FIG. 4b illustrates a cross-section view of a module 30 oriented for mounting in a 'bottom' position on the mounting rail 22. In each of the views a daughterboard module PCB 75 is illustrated connected to the module connector 65. The module PCB 75 is supported by the chassis of the module 30, though this connection is not visible in this view. As illustrated, the module connectors 65 are each positioned with a connection direction parallel to a pin direction of the module connector 65 through the module PCB 75.

A module aperture 67 in the device mounting surface 35 provides access to the module connector 65. An Ethernet port 13 is visible in the view in relation to the module connector 65 on the module PCB 75.

The module aperture 67 and the module connector 65 are positioned relative to the module locators 45 to provide for an operative connection with the device connector 60 when the module 30 is mounted on the mounting rail.

Figure 4C:
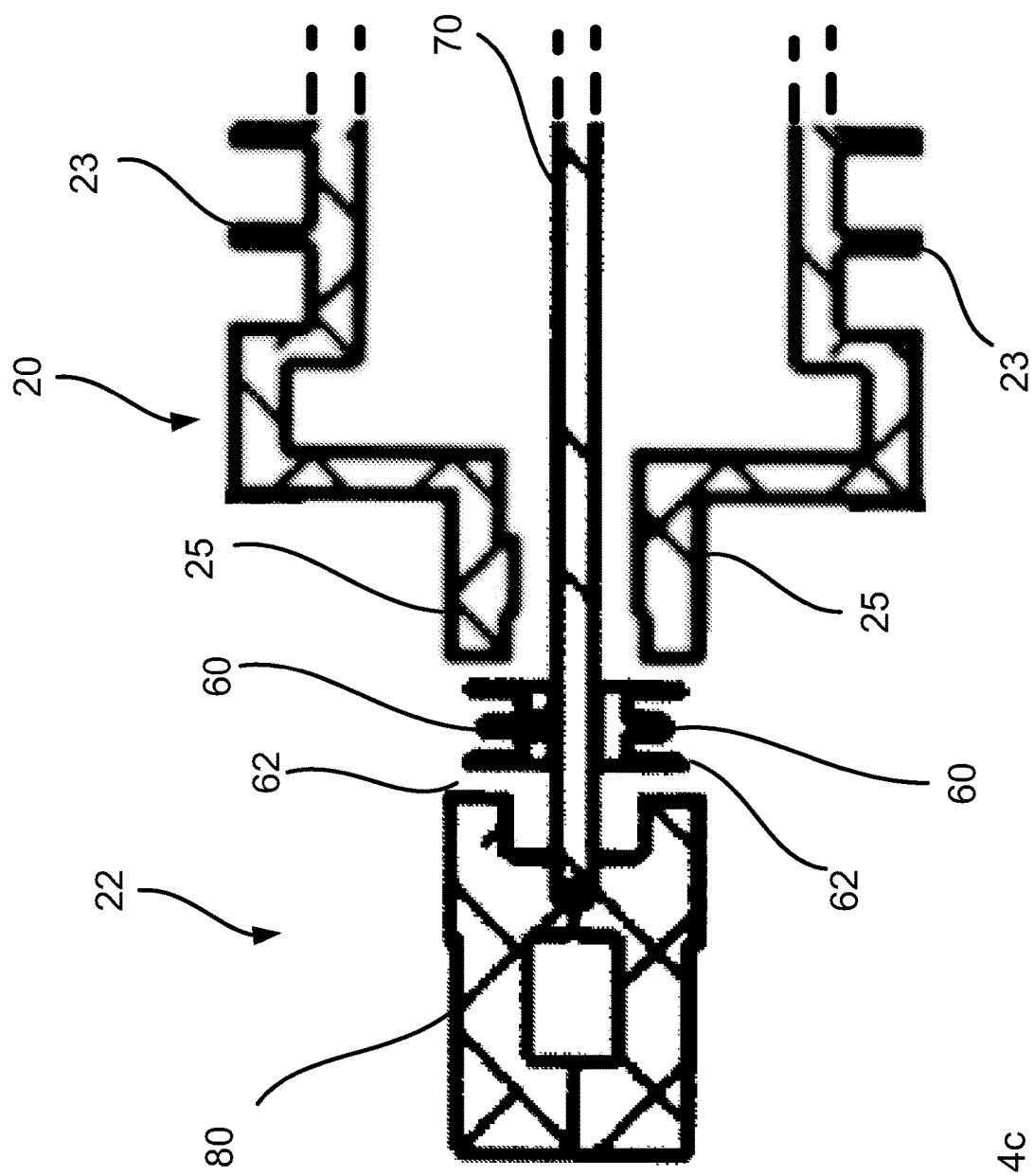
FIG. 4c is a section view of a mounting rail of a network device.

FIG. 4c illustrates a cross-section view of the mounting rail 22. The device PCB 70 is supported proximate the device connector 60 by a support portion 80 of the mounting rail 22. The support portion 80 captures and constrains the device PCB 70 to position and support the device connectors 60 relative to the device aperture 62 when the modules 30 are mounted on the mounting rail 22 and the module connectors 65 are engaged with, and connected to, the device connectors 60. The support portion 80 provides support to the device PCB proximate the device connector 60, to provide mechanical support to the device connectors 60. As illustrated, the device connectors 65 are each positioned with a connection direction parallel to a pin direction of that device connector 65 through the device PCB 75. The pin direction being the pins that extend from a base of the device connector 65 through the device PCB 75, and form the mechanical and electrical connection of the device connector 65 to the PCB 75.

Figure 4D:
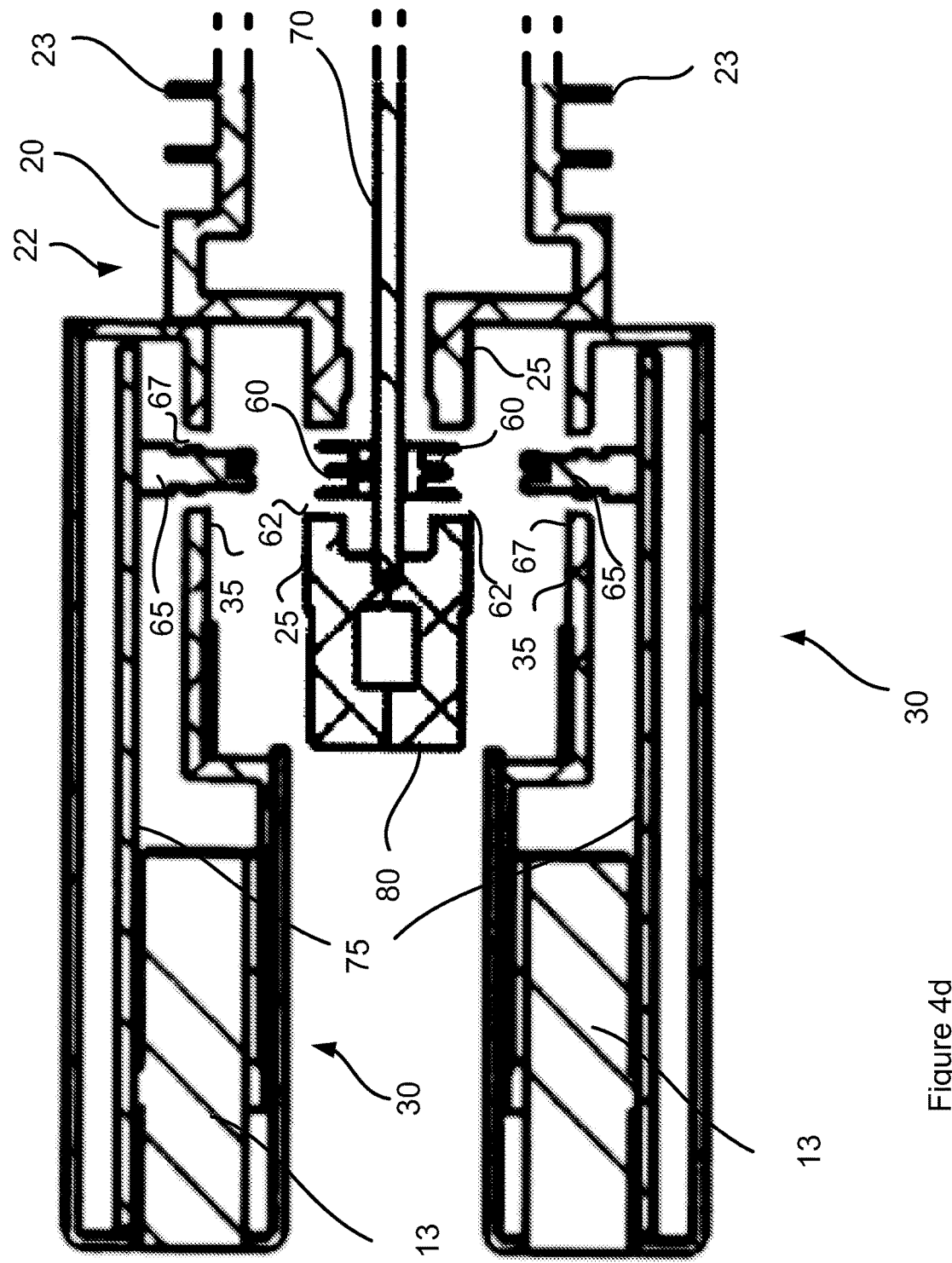
FIG. 4d is a section view of the mounting rail and modules in position for mounting.

FIG. 4d illustrates a cross-section view of the mounting rail 22 of FIG. 4c and the modules 30 of FIGS. 4a and 4b in position for mounting to the mounting rail 22. In the implementation of FIG. 4d, a pair of opposed modules 30 are provided to mount and attach to the mounting rail 22 from opposite sides of the mounting rail 22 and to advance in opposite mountings directions to one another to connect to each of their corresponding device connectors 60.

The device reference locators 40 and module reference locators 45, not visible in this cross-section view, act to position the modules 30 on the mounting location such that when the modules are mounted to the mounting rail 22, the module connectors 65 engage and connect to the device connectors 60.

Once secured, the fasteners 50 mechanically attach each module 30 to the mounting rail 22, and ensure that the device connector 65 is securely connected to the module connector 60. When mounted, the mated mounting surfaces 25, 35 provide a seal to seal the device apertures 62 and the module apertures 67 from the environment. In the implementation, the opposed modules 30 further provide for opposed mounting forces applied to the device PCB 70, resulting in a more stable connection. When the opposed pair of modules 30 are mounted to opposing locations on the mounting rail 22, the module connectors of the opposed pair of modules are in alignment and separated by the device connectors of the opposed mounting locations and the device PCB.

Accordingly, the mounting forces applied by the fasteners 50 of each of the opposed modules 30 applied to the device PCB 70 through the device connectors 60 act in opposition such that the device PCB 70 is in a slightly compressed state rather than a flexed state. Connecting the module connectors 65 to the device connectors 60 presses the connectors 60, 65 into the corresponding device PCB 70 or module PCB respectively.

Furthermore, the insertion forces that arise when connecting the modules 30 to the mounting rail 22 act in opposition to one another, and act in parallel to the pin directions of the connectors 60, 65. Accordingly, the forces act to press the connectors 60, 65 into the corresponding PCB 70, 75, rather than as a shear force between the connector 60, 65 and the PCB 70, 75.

In the implementation, the device connectors 60 are each attached to an opposite side of the device PCB 70 having opposite connection directions approximately orthogonal to the device PCB. The module connectors 65 are each attached to one of the module PCB's 75 with a module connecting direction approximately orthogonal to that module PCB 75. When mounting the modules 30 to the mounting rail 22, the mounting direction is approximately orthogonal to the device PCB and the module PCB's 75 when the module reference locators 45 are engaged with their corresponding device reference locators 40.

In an implementation, the device connector 60 and the module connector 65 comprise a pair of free height connectors. The free height connectors selected to provide a set-off between the position of the device PCB 70 and the module PCB 75 when the module 30 is mounted on the mounting rail 22 and the module mounting surface 35 is engaged with the device mounting surface 25.

Various embodiments of the present invention having been thus described in detail by way of example, it will be apparent to those skilled in the art that variations and modifications can be made without departing from the invention. The invention includes all such variations and modifications as fall within the scope of the appended claims.

I claim:

1. A network device comprising:
   a mounting rail of the network device having at least a pair of opposed mounting locations on opposite sides of the mounting rail, each of the mounting locations defined by one or more device reference locators that define a mounting direction relative to that mounting location, and each mounting location including a device connector attached to a device printed circuit board (PCB) and positioned to have a device connecting direction parallel to the mounting direction of that mounting location, wherein the mounting direction for each of the opposed mounting locations on the opposite sides of the mounting rail is towards that side of the mounting rail, wherein the mounting directions of the opposed mounting locations are in opposite directions from one another;
   at least one module for mounting to one of the mounting locations, wherein the module includes corresponding one or more module reference locators each adapted to engage one of the one or more device reference locators when the module is positioned to be mounted to the one of the mounting locations, and wherein the module includes a module connector electrically attached to a module PCB and positioned to have a module connecting direction parallel to the mounting direction of the one of the mounting locations;
   wherein the module connector and the device connector are positioned such that when the one or more module reference locators are each engaged with the corresponding one or more device reference locators of the one of the mounting locations, and the module is advanced in the mounting direction of the one of the mounting locations towards the one of the mounting locations, the module connector and the device connector connect as the module mounts to the one of the mounting locations to connect the module to the mounting rail of the network device, wherein the device connector of each of the opposed mounting locations is attached to the device PCB with the device connecting direction approximately orthogonal to a surface of the device PCB, wherein the module connector is attached to the module PCB with the module connecting direction approximately orthogonal to a surface of the module PCB, and wherein each of the mounting directions of the opposed mounting locations is approximately orthogonal to the surface of the device PCB and the surface of the module PCB when the one or more module reference locators are each engaged with the corresponding one or more device reference locators.

2. The network device of claim 1 wherein for each mounting location, a device pin direction of the device connector and a module pin direction of the module connector are parallel to the connecting direction and each mounting direction.

3. The network device of claim 1 wherein when the module advances in the mounting direction of the one of the mounting locations to connect the module to the device, the module connector is pressed into the module PCB and the device connector of the one of the mounting locations is pressed into the device PCB.

4. The network device of claim 1 wherein the one or more device reference locators and the corresponding one or more module reference locators of the one of the mounting locations comprise matched guide pin and receptacle pairs.

5. The network device of claim 4 wherein the guide pin comprises a feature of the mounting rail.

6. The network device of claim 1, wherein the one of the mounting locations comprises a device mounting surface and wherein the module has a corresponding device mounting surface, and wherein when the module is mounted on the one of the mounting locations, the module mounting surface is in contact with the device mounting surface.

7. The network device of claim 6 further comprising a device aperture through the device mounting surface and a module aperture through the module mounting surface, wherein the device connector of the one of the mounting locations is located to connect to the module connector through the device aperture, and wherein the module connector is located to connect to the device connector of the one of the mounting locations through the module aperture.

8. The network device of claim 7 wherein the device connector of the one of the mounting locations and the module connector comprise a free height connector pair, the free height connector pair having a spacing to connect the device connector of the one of the mounting locations to the module connector when the module mounting surface is in contact with the device mounting surface.

9. The network device of claim 6 wherein the module mounting surface and the device mounting surface are in sealing engagement when the module is mounted to the one of the mounting locations.

10. The network device of claim 6, wherein the mounting rail further comprises a support portion adapted to capture and constrain the device PCB at a location proximate the device connector.

11. The network device of claim 1, wherein the module corresponds to a first module, further comprising a second module for mounting with the first module as an opposed pair of modules mounted respectively to the opposed mounting locations.

12. The network device of claim 11 wherein the device connectors of the opposed mounting locations are located on opposite sides of the device PCB, such that when the opposed first and second modules are mounted to the respective opposed mounting locations, and the module connectors of the first and second modules are connected to the device connectors of the respective opposed mounting locations, the module connectors of the first and second modules are in opposed alignment.

13. The network device of claim 12, further comprising fasteners to secure the first and second modules to the respective opposed mounting locations, wherein the one or more device reference locators and the one or more module reference locators cooperate to position each of the fasteners relative to a corresponding fastener receiver on the mounting rail.

14. The network device of claim 13, wherein mounting forces applied by the fasteners of each of first and second modules applied to the device PCB through the device connectors act in opposition such that the device PCB is in a compressed state between the opposed modules.

15. The network device of claim 11 wherein for each mounting location, a device pin direction of the device connector and a module pin direction of the module connector are parallel to the connecting direction and each mounting direction.

\* \* \* \* \*